United States Patent

Endo et al.

[11] Patent Number: 6,048,397
[45] Date of Patent: Apr. 11, 2000

[54] GAASP EPITAXIAL WAFER AND A METHOD FOR MANUFACTURING IT

[75] Inventors: Masahisa Endo; Masataka Watanabe, both of Annaka; Tsuneyuki Kaise, deceased, late of Annaka, all of Japan, by Chiemi Kaise, executor

[73] Assignee: Shin-Etsu Handotai Co., Ltd., Tokyo, Japan

[21] Appl. No.: 08/998,835

[22] Filed: Dec. 29, 1997

[30] Foreign Application Priority Data

Jan. 6, 1997 [JP] Japan ............................. 9-011782

[51] Int. Cl.[7] .................................................. C30B 25/04
[52] U.S. Cl. ......................... 117/89; 117/102; 117/103; 117/104; 117/954; 117/955
[58] Field of Search ............................. 117/89, 102, 103, 117/104, 954, 955

[56] References Cited

U.S. PATENT DOCUMENTS

| | | |
|---|---|---|
| 3,873,382 | 3/1975 | Groves et al. . |
| 4,510,515 | 4/1985 | Kajita et al. . |
| 5,041,883 | 8/1991 | Lindquist et al. . |
| 5,456,675 | 10/1995 | Sato et al. ................................. 148/33 |
| 5,751,026 | 5/1998 | Sato et al. ................................. 257/190 |

FOREIGN PATENT DOCUMENTS

| | | |
|---|---|---|
| 2 373 167 | 12/1976 | France . |
| 43 25 331 A 1 | 2/1994 | Germany . |
| 56-118329 | 9/1981 | Japan . |
| 61-106497 | 5/1986 | Japan . |
| 63-092014 | 4/1988 | Japan . |
| 02094577 | 4/1990 | Japan . |
| 08335716 | 12/1996 | Japan . |

OTHER PUBLICATIONS

Matsushima et al., "Nitrogen doping into GaAs P using ionized beam in molecular beam epitaxy", Journal of Crystal Growth, vol. 43 No. 3 pp. 281–286, 1978.

*Primary Examiner*—Robert Kunemund
*Attorney, Agent, or Firm*—Snider & Associates; Ronald R. Snider

[57] ABSTRACT

A GaAsP epitaxial wafer 10 which has a $GaAs_{1-x}P_x$ (0.45<x<1) constant nitrogen concentration layer 6 formed by doping a constant composition layer with nitrogen wherein the constant nitrogen concentration layer 6 has the following upper and lower limits of nitrogen concentration:

Upper limit: $N=(6.25x-1.125)\times 10^{18}$ cm$^{-3}$

Lower limit: $N=(5x-1.5)\times 10^{18}$ cm$^{-3}$

1 Claim, 6 Drawing Sheets

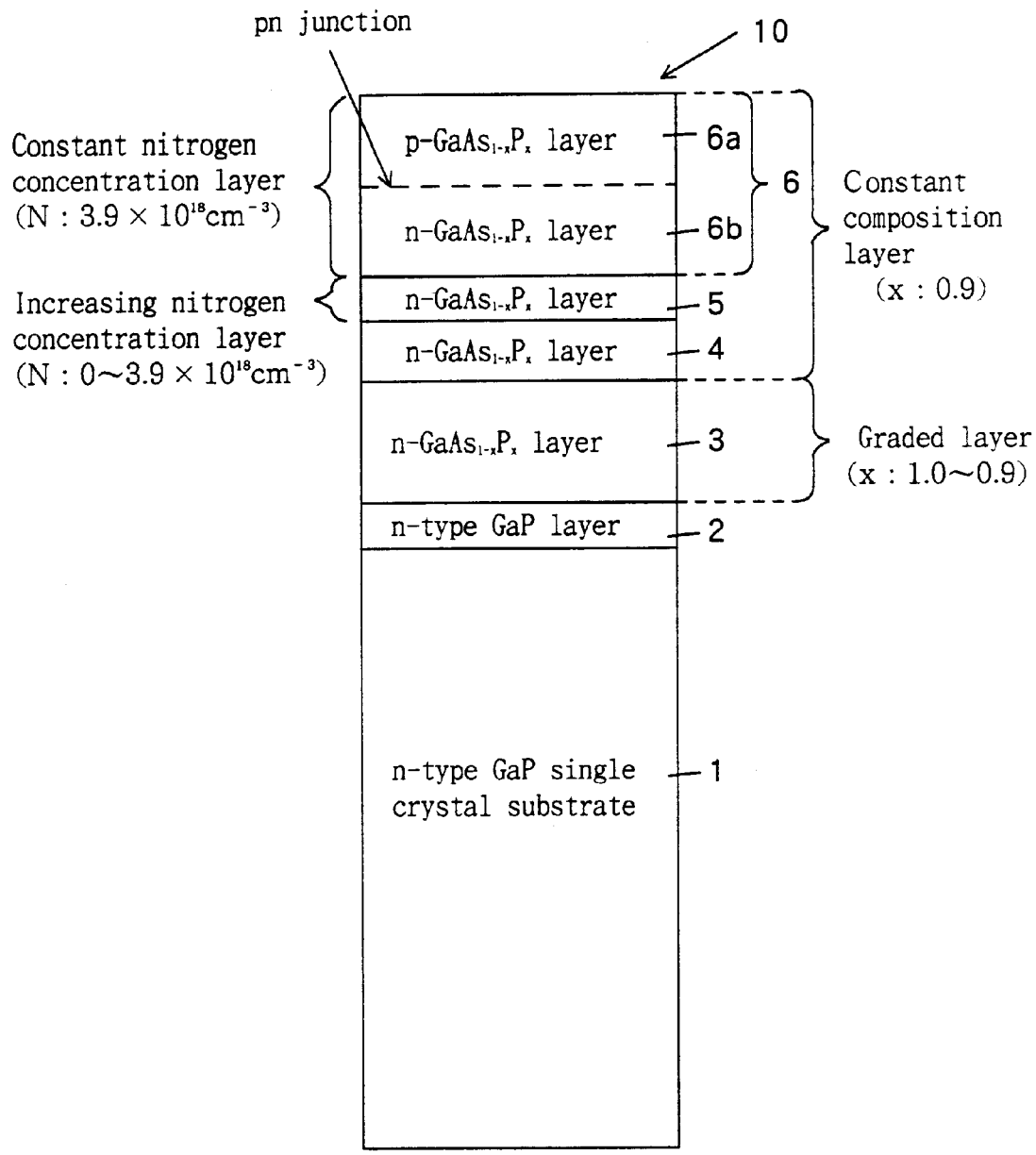
F I G. 1

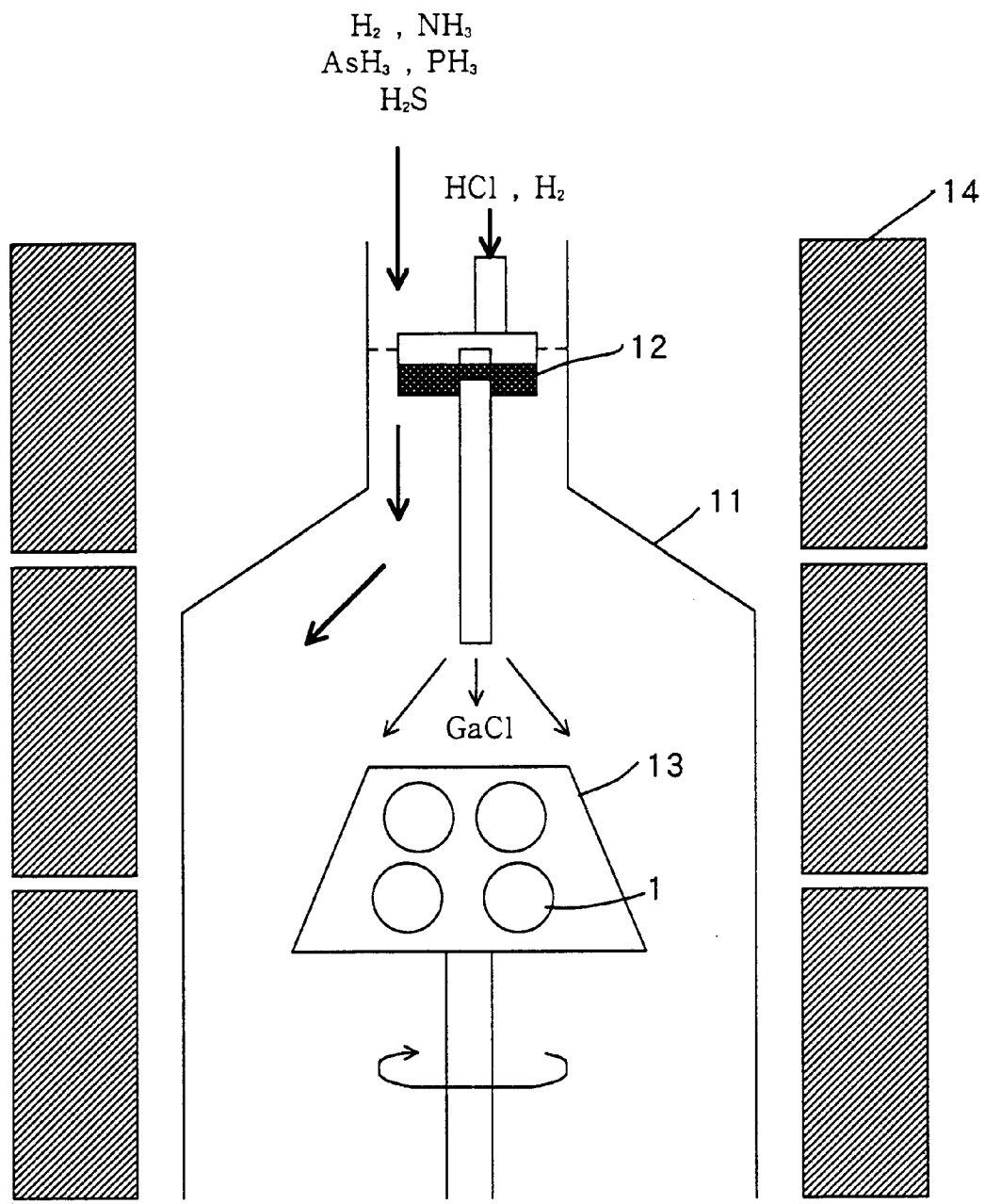
F I G. 2

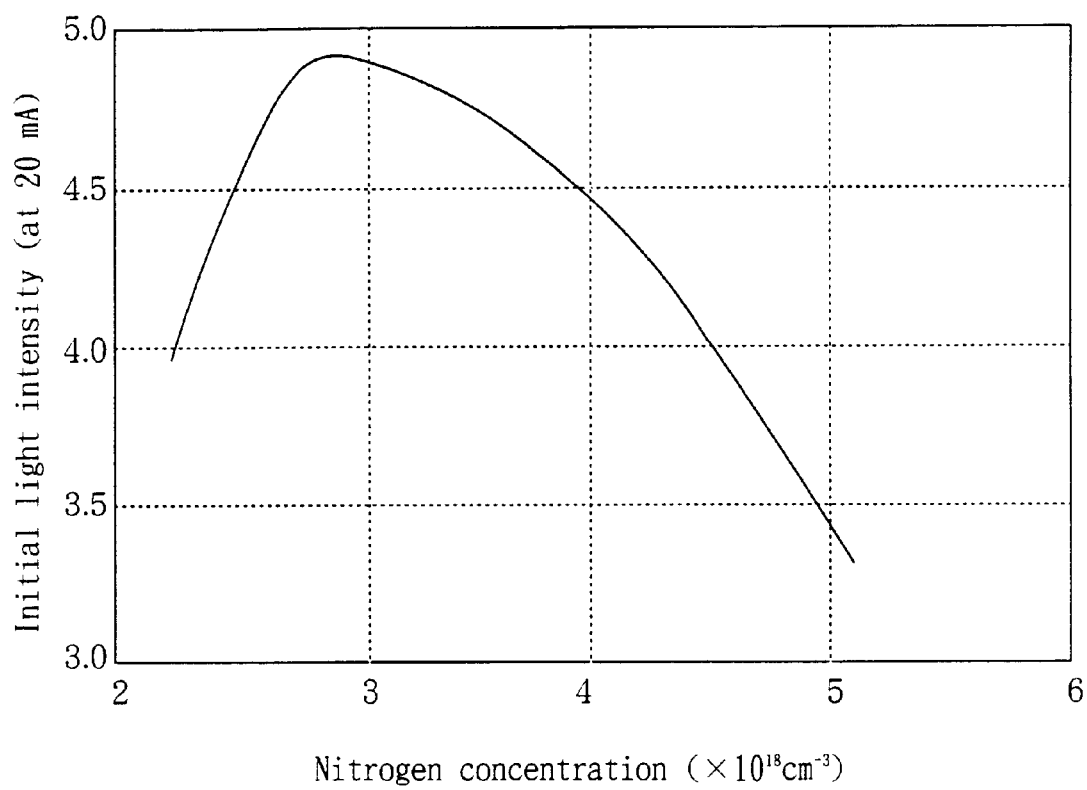
F I G. 3

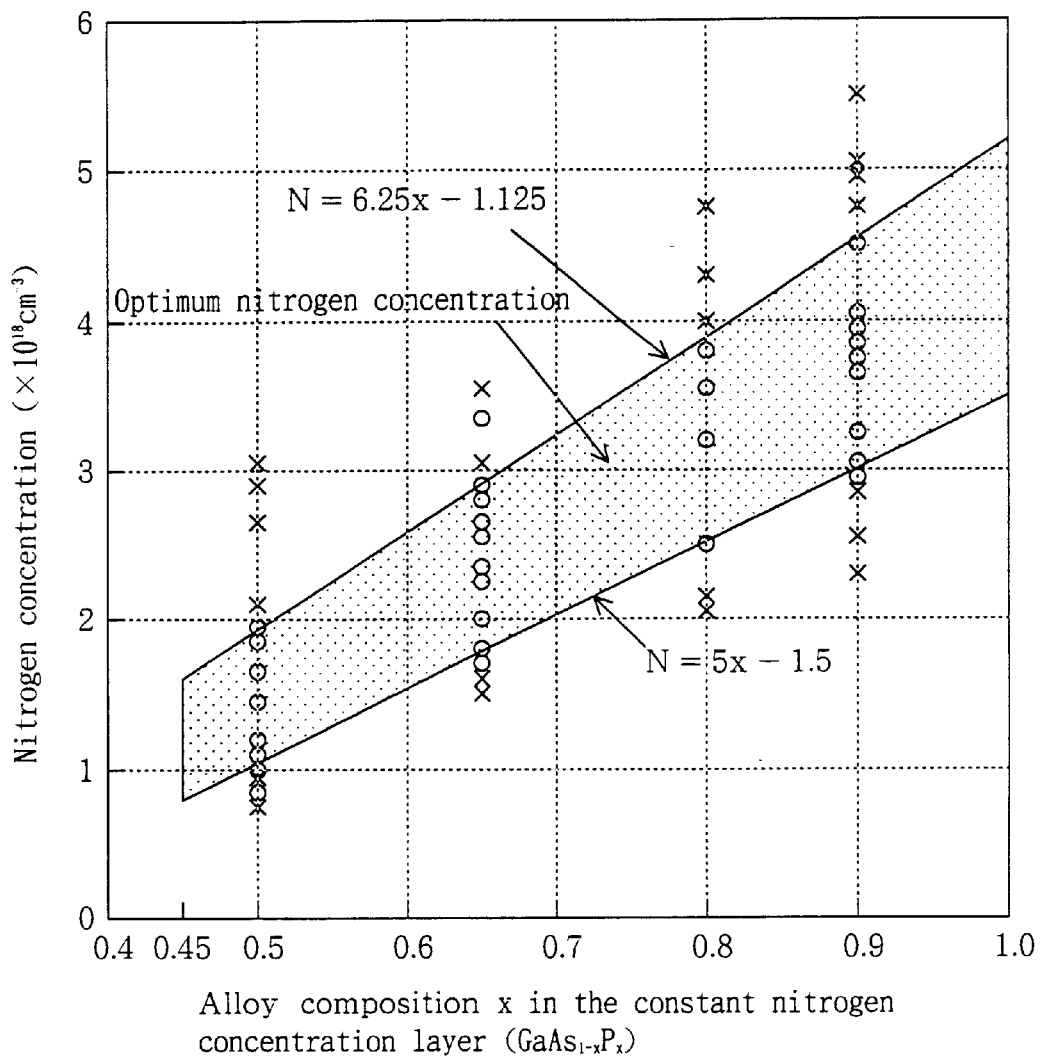
F I G. 5

GAASP EPITAXIAL WAFER AND A METHOD FOR MANUFACTURING IT

RELATED APPLICATION

This application claims the priority of Japanese Patent application No.9-11782 filed on Jan. 6, 1997, which is incorporated herein by reference.

BACKGROUND OF THE INVENTION

1. Field of the Invention

This invention relates in general to a compound semiconductor epitaxial wafer and a method for manufacturing it, and more particularly to a GaAsP epitaxial wafer and a method for manufacturing it.

2. The Prior Art

A light emitting diode is manufactured by using compound semiconductors of groups III–V such as GaP, GaAs, GaAsP and GaAlAs. Light is generated by feeding a forward direction current through the pn junction of said compound semiconductor. The wavelength of emitted light is different depending on the composition of the compound semiconductor and the impurities added therein.

A GaAsP (gallium phosphide arsenide) epitaxial wafer for a light emitting diode with a composition of $GaAs_{1-x}P_x$ (0.45<x<1) emits light of the wavelength which varies according to the forbidden band energy gap of the semiconductor by changing the alloy composition (x) thereof. The light emitting diode emits red, orange or yellow light according to the values of the alloy composition (x) when x=0.50, x=0.65 or x=0.90, respectively. The light emitting diode with the aforementioned composition is of an indirect transition type. The constant composition layer is doped with nitrogen which becomes a light emitting center to increase the probability of radiative recombination and thus improve the light emitting efficiency.

As shown in FIG. 6, a conventional GaAsP epitaxial wafer is manufactured, for example, by: carrying out the epitaxial growth of an n-type $GaAs_{1-x}P_x$ graded layer 23 in which the alloy composition is gradually increased from 0 and n-type $GaAs_{1-x}P_x$ constant composition layers 24, 25 and 26 with constant alloy composition one after another on a GaP single crystal substrate 21, and then diffusing a p-type impurity from the surface of said constant composition layer 26 to form a pn junction between a p-type constant composition layer 26a which corresponds to a region in the layer 26 where the impurity was diffused and an n-type constant composition layer 26b which corresponds to a region in the layer 26 where the impurity was not diffused. The layer 25 is an increasing nitrogen concentration layer in which gradually more nitrogen is added and layer 26 is a constant nitrogen concentration layer.

Conventionally, the epitaxial growth of constant nitrogen concentration layer 26 was carried out while a relatively low concentration of nitrogen was added so that the initial light intensity would not decrease due to absorption of light by the layer.

The light emitting diode made from the GaAsP epitaxial wafer radiates light of a wavelength corresponding to the band gap of the constant nitrogen concentration layer 26 from the pn junction. Generally, a light emitting diode exhibits a degradation in which the light intensity decreases over the course of its operation life. It is known that a light emitting diode of 0.3 mm×0.3 mm square which has operated for 1,000 hours by a 30 mA current (current density 33 $A/cm^2$) decreases in its light intensity down to 40–80% of the initial intensity immediately after it is just energized, though it depends on the operation environment. For example, in the case of a yellow light emitting diode with nitrogen concentration of $2.0 \times 10^{18}$ $cm^{-3}$, it degradates down to 40% of the initial light intensity after it has operated for 1,000 hours with a current density of 33 $A/cm^2$ at 25° C. Therefore, it is very important to reduce degradation of light intensity and improve the operation life in terms of the characteristics of a light emitting diode.

BRIEF SUMMARY OF THE INVENTION

The object of the present invention is to provide a GaAsP epitaxial wafer from which a light emitting diode with a high initial light intensity and less degradation of the light intensity can be manufactured and also to provide a method for manufacturing it.

One aspect of the present invention provides a GaAsP epitaxial wafer which has a $GaAs_{1-x}P_x$ (0.45<x<1) constant nitrogen concentration layer formed by doping a constant composition layer with nitrogen wherein the constant nitrogen concentration layer has the following upper and lower limits of nitrogen concentration:

Upper limit: $N=(6.25x-1.125) \times 10^{18}$ $cm^{-3}$

Lower limit: $N=(5x-1.5) \times 10^{18}$ $cm^{-3}$

Another aspect of the present invention provides a method for manufacturing a GaAsP epitaxial wafer which has a $GaAs_{1-x}P_x$ (045<x<1) constant nitrogen concentration layer formed by doping a constant composition layer with nitrogen wherein the constant nitrogen concentration layer is doped with nitrogen whose concentration is equal to or above the level at which the initial light intensity of a light emitting element made from the GaAsP epitaxial wafer begins to decrease if the concentration is lower.

Preferably, the nitrogen concentration is in the range between the following upper and lower limits of nitrogen concentration:

Upper limit: $N=(6.25x-1.125) \times 10^{18}$ $cm^{-3}$

Lower limit $N=(5x-1.5) \times 10^{18}$ $cm^{-3}$

The present invention is described in detail below. The present invention is based on the experimental finding to the effect that there was a strong correlation between operation life and nitrogen dopant concentration in the constant nitrogen concentration layer of the light emitting diode and that the light intensity degradation was reduced as the nitrogen concentration in the constant nitrogen concentration layer increased. However, the nitrogen doped in the nitrogen concentration layer becomes a light emitting center of indirect transition as well as a light absorbing center. Therefore, it became clear that the emitted light is absorbed by the nitrogen and the light intensity decreases if the nitrogen concentration is raised too high. Accordingly, the nitrogen concentration in the constant nitrogen concentration layer has to be adjusted to within the optimum range in order to have high initial light intensity and also to minimize the light intensity degradation.

Also, the inventors conducted a number of experiments to make it clear that the optimum range of the constant nitrogen concentration layer varies dependent on the alloy composition (x) between As and P. As a result, the optimum nitrogen concentration range as a function of the composition (x) of As and P in the mixed crystal was defined by the following equations:

Upper limit of nitrogen concentration:

$$N=(6.25x-1.125)\times 10^{18} \text{ cm}^{-3}$$

Lower limit of nitrogen concentration:

$$N=(5x-1.5)\times 10^{18} \text{ cm}^{-3}$$

Light emitted by the nitrogen in the constant nitrogen concentration layer is absorbed thereby and the initial light intensity becomes too low if the nitrogen concentration is exceeded the upper limit. On the other hand, the light intensity degradation occurs earlier and the operation life becomes too short if the nitrogen concentration falls below the lower limit.

As described thus far, the present invention makes it possible to manufacture a light emitting diode which has a high initial light intensity and less degradation of the light intensity by setting the nitrogen concentration in the constant nitorgen concentration layer at a specific concentration range corresponding to the alloy composition.

BRIEF DESCRIPTION OF THE DRAWING

FIG. 1 is a schematic cross section showing an example of the configuration of the GaAsP epitaxial wafer according to the present invention.

FIG. 2 is a schematic illustration of the epitaxial growth apparatus used for manufacturing the GaAsP epitaxial wafer according to the present invention.

FIG. 3 shows the relationship between the nitrogen concentration in the constant nitrogen concentration layer and the initial light intensity for light emitting diodes which emit light having wavelength of 583 nm, which are made from GaAsP epitaxial wafers according to the present invention.

FIG. 5 shows the optimum nitrogen concentration range vs. the alloy composition in the constant nitrogen concentration layer which gives high initial light intensity and also high remaining light intensity ratio of the light emitting diode.

EMBODIMENTS

Figure 4:
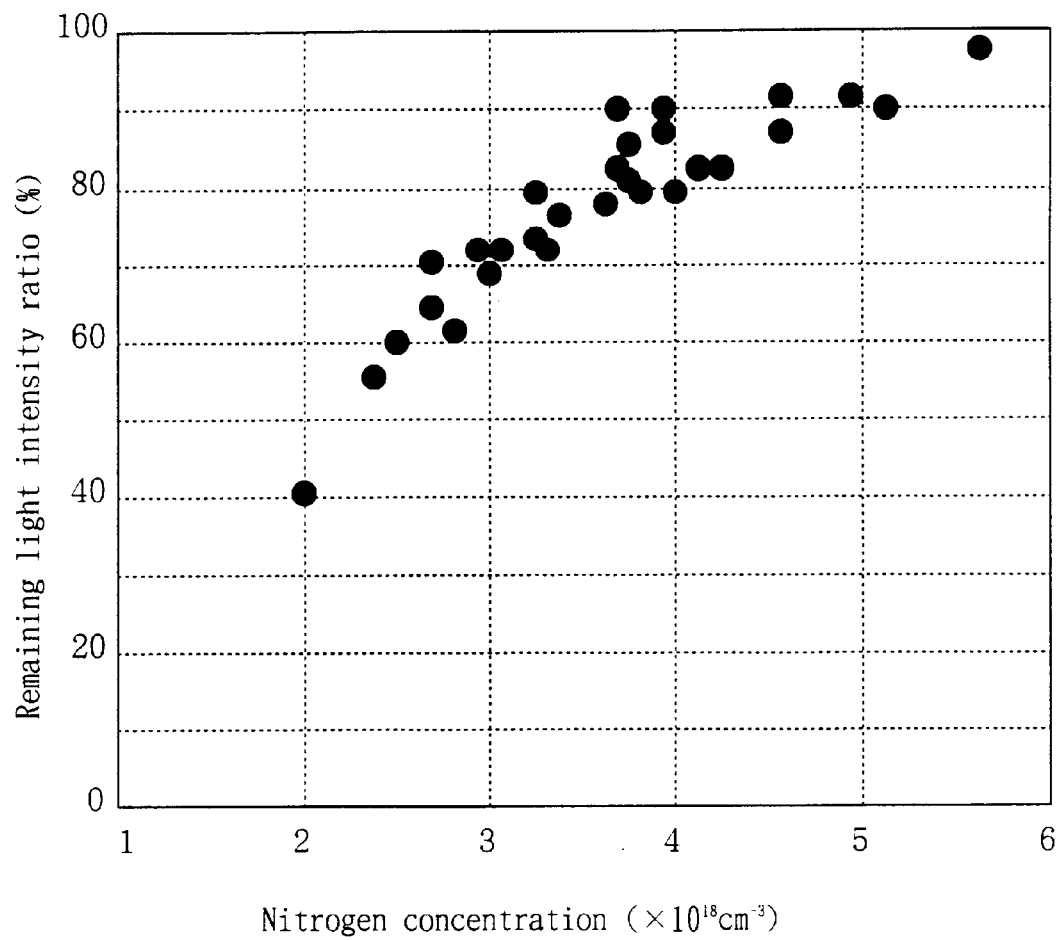
FIG. 4 shows the relationship between the nitrogen concentration in the constant nitrogen concentration layer of the light emitting diodes and the remaining light intensity ratio.

The GaAsP epitaxial wafer according to the present invention is described below by referring to the attached drawings.

FIG. 1 is a schematic cross section which illustrates the configuration of one embodiment of the GaAsP epitaxial wafer for light emitting diodes according to the present invention. The GaAsP epitaxial wafer 10 is configured as follows: an n-type GaP epitaxial layer 2 is formed on an n-type GaP single crystal substrate 1; on top of this, an n-type GaAs$_{1-x}$P$_x$ graded layer 3 is formed wherein the alloy composition (x) changes from 1.0 to 0.9 along the direction of the depth of the layer, for example; on top of this, n-type GaAs$_{1-x}$P$_x$ constant composition layers 4–6 are formed wherein the alloy composition (x) is fixed at 0.9. Then n-type GaAs$_{1-x}$P$_x$ constant composition layer 5 is an increasing nitrogen concentration layer doped with nitrogen such that the nitrogen concentration gradually increases from 0 to 3.9×10$^{18}$ cm$^{-3}$ along the direction of the depth. The n-type GaAs$_{1-x}$P$_x$ constant composition layer 6 is a constant nitrogen concentration layer doped with a constant nitrogen concentration of 3.9×10$^{18}$ cm$^{-3}$, for example. After the epitaxial growth, thermal diffusion of a p-type impurity is carried out from the surface of the epitaxial layer to change the upper layer to p-type, thus comprising the constant nitrogen concentration layer 6 with a pn junction between the n-type GaAs$_{1-x}$P$_x$ constant composition layer 6a and the p-type GaAs$_{1-x}$P$_x$ constant composition layer 6b.

Figure 6:
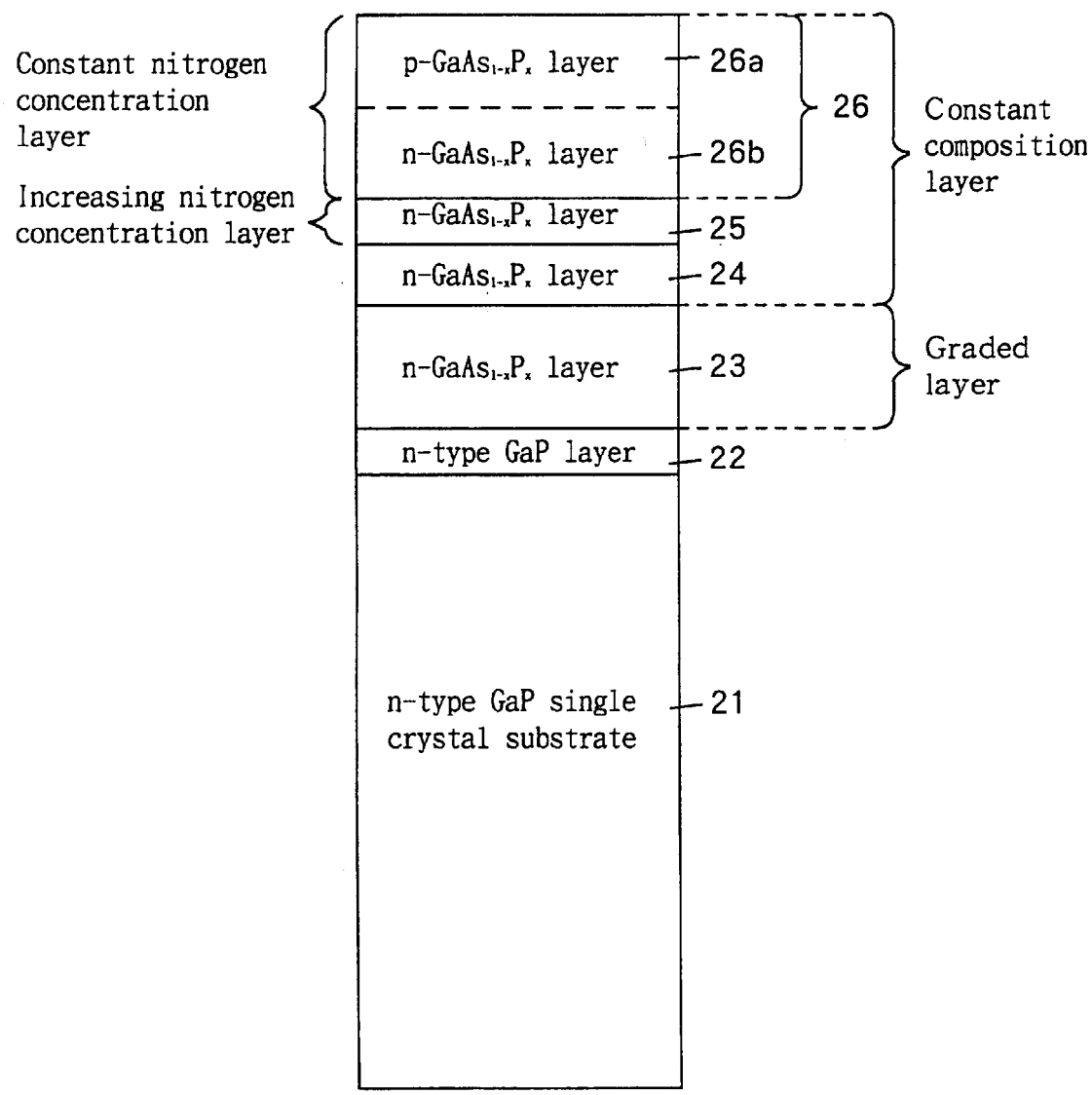
FIG. 6 is a schematic cross section showing an example of the configuration of a conventional GaAsP epitaxial wafer.

The GaAsP epitaxial wafer shown in FIG. 1 according to the present invention is structurally the same as the conventional GaAsP epitaxial wafer shown in FIG. 6. However, it is completely different from the conventional one in terms of the nitrogen concentration added to the constant nitrogen concentration layer.

FIG. 2 is a schematic illustration of the epitaxial growth apparatus used for manufacturing the GaAsP epitaxial wafer according to the present invention. In this apparatus, PH$_3$, AsH$_3$ and NH$_3$ gases which are the group III materials as well as the carrier gas H$_2$ are supplied from the top of a reactor tube 11, and simultaneously GaCl is supplied by feeding HCl to a Ga container 12 to generate GaCl to grow a GaAs$_{1-x}$P$_x$ epitaxial layer on a GaP substrate.

The present invention makes it possible to manufacture a light emitting diode which has high initial light intensity and less degradation of the light intensity by setting the nitrogen concentration in the constant nitrogen concentration layer at a specific concentration range corresponding to the alloy composition.

EXAMPLES

Examples of the present invention are described below.

Example 1

A GaAsP epitaxial wafer for a yellow light emitting diode including a GaAs$_{1-x}$P$_x$ constant composition layer with alloy composition (x) of 0.9 was manufactured in the following manner.

The substrate was of an n-type GaP single crystal doped with sulfur with a thickness of approximately 300 micrometers, a crystal axis orientation of <100> and an off angle of 10 degrees. For the carrier gas and the reaction gases, hydrogen (H$_2$), 50 ppm hydrogen sulfide (H$_2$S) diluted with hydrogen, 10% arisine (AsH$_3$) diluted with hydrogen, 10% phosphine (PH$_3$) diluted with hydrogen, high purity hydrogen chloride (HCl) and high purity ammonia (NH$_3$) were used.

An n-type GaP single crystal substrate 1 was placed in the gas phase epitaxial growth apparatus shown in FIG. 2, and a Ga container 12 in which high purity Ga was contained was set in an upper portion of a reactor tube 11. Hydrogen H$_2$ as a carrier gas was introduced into the reactor tube 11 to be thoroughly replaced for the other gas therein, and then heating of the reactor tube 11 was initiated with a heater 14.

After the n-type GaP single crystal substrate 1 reached 820° C., HCl was introduced into the reactor tube 11 at a rate of 45 ml/minute to generate GaCl by its reaction with Ga in the Ga container 12, and simultaneously H$_2$S and PH$_3$ were introduced thereinto at the rates of 70 ml/minute and 180 ml/minute respectively to grow an n-type GaP epitaxial layer 2 doped with sulfur with a thickness of approximately 3 micrometers on the n-type GaP single crystal substrate 1 in 30 minutes. All the epitaxial layers to be grown hereafter would be doped with sulfur and hence all of them would be n-type.

An n-type GaAs$_{1-x}$P$_x$ graded layer 3 was then grown on top of the n-type GaP epitaxial layer 2. The flow rate of PH$_3$ was reduced from 180 ml/minute to 162 ml/minute while simultaneously the flow rate of AsH$_3$ was increased from 0 ml/minute to 18 ml/minute over the course of 35 minutes to grow 4 micrometers of an n-type GaAs$_{1-x}$P$_x$ graded layer with alloy composition gradually changing from 1.0 to 0.9.

An n-type GaAs$_{1-x}$P$_x$ constant composition layer 4 with a thickness of approximately 4 micrometers and alloy composition (x) of 0.9 (constant) was then grown in 35 minutes.

Then, in order to carry out doping with nitrogen which acts as a light emitting center, the flow rate of NH$_3$ was gradually increased from 0 ml/minute to 115 ml/minute over the course of 35 minutes to grow an n-type GaAs$_{1-x}$P$_x$ constant composition layer 5 (increasing nitrogen concentration layer) with a thickness of approximately 4 micrometers and a gradually increasing nitrogen concentration of 0 to $3.9 \times 10^{18}$ cm$^{-3}$.

Then, the flow rate of H$_2$S was set at 2 ml/minute while simultaneously the flow rate of NH$_3$ was set at a constant of 115 ml/minute to grow, in 160 minutes, a 20-micrometer thick n-type GaAs$_{1-x}$P$_x$ constant composition layer 6 (constant nitrogen concentration layer) with a nitrogen concentration of $3.9 \times 10^{18}$ cm$^{-3}$.

After growing epitaxial layers 2–6 on the n-type GaP single crystal substrate 1 as described thus far, zinc was thermally diffused from the surface of the n-type GaAs$_{1-x}$P$_x$ constant nitrogen concentration layer 6 to a depth of 7 micrometers in a diffusion furnace to obtain a GaAsP epitaxial wafer 10 for a yellow light emitting diode which emits light of the wavelength of 583 nm which had constant nitrogen concentration layer 6 comprising a p-type GaAs$_{1-x}$P$_x$ constant composition layer 6a and an n-type GaAs$_{1-x}$P$_x$ constant composition layer 6b.

The yellow light emitting diode made from a 0.3 mm×0.3 mm square chip of the GaAsP epitaxial wafer for a yellow light emitting diode had high initial light intensity of 5.0 mcd when operated with a 20 mA direct current. Here, the light intensity is defined as a value of a light flux from a point light source in a certain direction expressed as light flux per unit solid angle toward that direction with the light source as the apex. Also, the initial light intensity is defined as a light intensity value detected by a light intensity detector when a light emitting diode is energized for the first time after it is manufactured. Since the light intensity increases in proportion to the current flowing through the light emitting diode, the light intensity was measured by using 20 mA of a direct current (hereafter all the light intensity measurements were done in the same manner.)

After the light emitting diode was operated with a current density of 33 A/cm$^2$ for 1,000 hours, the light intensity was 4.4 mcd, i.e. the remaining light intensity ratio was 88%. This means that the obtained light emitting diode has the minimum light intensity degradation. Here, the remaining light intensity ratio is defined as a ratio of the light intensity of the light emitting diode detected by a light intensity detector after operating it with a direct current of 33 A/cm$^2$ for 1,000 hours at 25° C. to the initial light intensity (%) (hereafter all the remaining light intensity ratios are calculated in the same manner). This ratio represents the degree of light intensity degradation.

Remaining light intensity ratio=(light intensity after 1,000 hours of operation initial light intensity)×100 (%)

FIG. 3 shows the relationship between the nitrogen concentration in the constant nitrogen concentration layer 6 and the initial light intensity for light emitting diodes made from wafers formed by setting various values for only the nitrogen concentration in the constant nitrogen concentration layer 6 of the GaAsP epitaxial wafer 10 whose structure is shown in Example 1. As shown in FIG. 3, when the nitrogen concentration in constant nitrogen concentration layer 6 is low, then the light emission efficiency is low and the initial light intensity of the light emitting diode is low. However, if the nitrogen concentration is too high, then the crystallinity degrades and the emitted light is absorbed by nitrogen atoms, also resulting in the reduction in the initial light intensity of the light emitting diode.

FIG. 4 shows the relationship between the nitrogen concentration in the constant nitrogen concentration layer 6 of each of the aforementioned light emitting diodes and the remaining light intensity ratio. As shown in FIG. 4, as the nitrogen concentration in the constant nitrogen concentration layer 6 increases, the light intensity degradation characteristics improve and the remaining light intensity ratio rises.

FIG. 3 and FIG. 4 indicate that, a light emitting diode with an initial light intensity of 4.0 mcd or more and a remaining light intensity ratio of 70% or more can be manufactured when the nitrogen concentration in the constant nitorgen concentration layer 6 is $3.0 \times 10^{18}$ cm$^3$ to $4.5 \times 10^{18}$ cm$^3$ in the case of the GaAsP epitaxial wafer for a yellow light emitting diode.

Example 2

Table 1 shows the color of the emitted light, the wavelength of the emitted light, the alloy composition in the constant nitrogen concentration layer, the nitrogen concentration in the constant nitrogen concentration layer, the initial light intensity and the remaining light intensity ratio of each of the light emitting diodes obtained by forming the GaAsP epitaxial wafers with the structure shown in Example 1 wherein the alloy composition (x) in constant nitrogen concentration layer 6 was set at 0.9 (yellow), 0.8 (yellow brown), 0.6 (orange) and 0.5 (red) and three nitrogen concentrations were used for each alloy composition.

TABLE 1

| Color of the emitted light | Wavelength of the emitted light (nm) | Alloy composition x | Nitrogen concentration (× 10$^{18}$ cm$^{-3}$) | Initial light intensity (mcd) | Remaining light intensity ratio |
|---|---|---|---|---|---|
| Yellow | 583 | 0.9 | 2.3 | 4.3 | 54 |
|  |  |  | 3.9 | 5.0 | 88 |
|  |  |  | 5.6 | 3.4 | 98 |
| Yellow brown | 605 | 0.8 | 1.8 | 4.1 | 56 |
|  |  |  | 3.6 | 4.5 | 89 |
|  |  |  | 4.7 | 2.8 | 99 |
| Orange | 626 | 0.65 | 1.2 | 4.0 | 59 |
|  |  |  | 2.3 | 4.8 | 88 |
|  |  |  | 3.5 | 3.4 | 96 |
| Red | 648 | 0.5 | 0.8 | 4.2 | 57 |
|  |  |  | 1.5 | 4.6 | 77 |
|  |  |  | 3.1 | 3.1 | 98 |

As shown in Table 1, at each value of the alloy composition (x), when the nitrogen concentration in the constant nitrogen concentration layer is low, the initial light intensity is high (4.0 mcd or more) but the remaining light intensity ratio is 70% or less, indicating severe degradation. On the other hand, when the nitrogen concentration in the constant nitrogen concentration layer is high, the remaining light intensity ratio is 90% or more, which is high and superior, but the initial light intensity is too low (4.0 mcd or lower).

Therefore, the middle and optimum nitrogen concentration is the best because it gives a high initial light intensity of 4.0 mcd or more and also a high remaining light intensity ratio of 70% or more, indicating less degradation.

FIG. 5 shows the results of experiments in which the nitrogen concentration was changed in finer steps for the aforementioned four alloy compositions in search of combinations of the alloy composition and the nitrogen concentration in the constant nitrogen concentration layer which would give a high initial light intensity and also a high remaining light intensity ratio. The mark "○" indicates that the initial light intensity is 4.0 mcd or more and the remaining light intensity ratio is 70% or more, and the mark "X" indicate that the initial light intensity is less than 4.0 mcd or the remaining light intensity ratio is less than 70%. As shown in FIG. 5, the optimum nitrogen concentration area where the initial light intensity and the remaining light intensity ratio are both high is an area between the upper and lower limit lines of the nitrogen concentration which are expressed as functions of the alloy composition (x).

Upper limit: $N=(6.25x-1.125)\times 10^{18}$ cm$^{-3}$

Lower limit: $N=(5x-1.5)\times 10^{18}$ cm$^{-3}$

What is claimed is:

1. A method for manufacturing a GaAsP epitaxial wafer which has a GaAs$_{1-x}$P$_x$ 0.45<x<1) constant nitrogen concentration layer formed by doping a constant composition layer with nitrogen wherein said constant nitrogen concentration layer is doped with nitrogen whose concentration is in the range between upper and lower limits of nitrogen concentration which are a function of X as set forth in the following expressions:

Upper limit: $N=(6.25x-1.125)\times 10^{18}$ cm$^{-3}$

Lower limit: $N=(5x-1.5)\times 10^{18}$ cm$^{-3}$.

* * * * *